(12) United States Patent
Jung et al.

(10) Patent No.: US 11,759,813 B2
(45) Date of Patent: Sep. 19, 2023

(54) APPARATUS FOR SUPPLYING CHEMICAL LIQUID

(71) Applicant: SEMES CO., LTD, Cheonan-si (KR)

(72) Inventors: Jeeyong Jung, Cheonan-si (KR); Dongyun Lee, Cheonan-si (KR)

(73) Assignee: SEMES CO., LTD, Cheonan-si (KR)

( * ) Notice: Subject to any disclaimer, the term of this patent is extended or adjusted under 35 U.S.C. 154(b) by 0 days.

(21) Appl. No.: 17/483,899

(22) Filed: Sep. 24, 2021

(65) Prior Publication Data
US 2022/0105531 A1 Apr. 7, 2022

(30) Foreign Application Priority Data
Oct. 6, 2020 (KR) .......................... 10-2020-0128433

(51) Int. Cl.
*B05B 14/00* (2018.01)
*B05B 15/40* (2018.01)

(52) U.S. Cl.
CPC .............. *B05B 14/00* (2018.02); *B05B 15/40* (2018.02)

(58) Field of Classification Search
USPC ...................... 118/302, 313–315; 347/22–33
See application file for complete search history.

(56) References Cited

U.S. PATENT DOCUMENTS

| 6,273,545 B1* | 8/2001 | Oide | B41J 2/16532 |
| | | | 347/30 |
| 2006/0244799 A1* | 11/2006 | Sasa | B41J 2/17509 |
| | | | 347/89 |
| 2011/0199423 A1* | 8/2011 | Shimazaki | B41J 2/16523 |
| | | | 347/29 |

FOREIGN PATENT DOCUMENTS

| KR | 10-1999-0063413 A | 7/1999 |
| KR | 10-2010-0064335 A | 6/2010 |
| KR | 10-2010-0081867 A | 7/2010 |
| KR | 10-2018-0071079 A1 | 6/2018 |
| KR | 10-1948689 B1 | 2/2019 |

* cited by examiner

*Primary Examiner* — Yewebdar T Tadesse
(74) *Attorney, Agent, or Firm* — DALY CROWLEY MOFFORD & DURKEE, LLP

(57) ABSTRACT

An apparatus for supplying chemical liquid may include a chemical liquid supply head, a receiving member, a removing member and a supplying member. The chemical liquid supply head may provide a chemical liquid onto a substrate. The receiving member may receive a recycle chemical liquid discharged from the chemical liquid supply head, and the removing member may remove impurities remaining in the recycle chemical liquid received in the receiving member. The supplying member may provide the recycle chemical liquid from which the impurities are removed to the chemical liquid supply head.

18 Claims, 3 Drawing Sheets

APPARATUS FOR SUPPLYING CHEMICAL LIQUID

CROSS-REFERENCE TO RELATED APPLICATION

This application claims priority to Korean Patent Application No. 10-2020-0128433 filed on Oct. 6, 2020 in the Korean Intellectual Property Office (KIPO), the contents of which are herein incorporated by reference in its entirety.

BACKGROUND

1. Field

Example embodiments of the invention relate to an apparatus for supplying chemical liquid. More particularly, example embodiments of the invention relate to an apparatus for supplying chemical liquid including a chemical liquid supply head capable of providing chemical liquid onto a substrate in a jetting process.

2. Related Technology

In manufacturing processes for a display device such as an organic light emitting display device, chemical liquid may be supplied onto a plurality of regions of a substrate so as to form various pixels on the substrate. Additionally, the chemical liquid may be provided onto the substrate and circuit patterns formed on the substrate for forming an encapsulation layer protecting the circuit patterns. In general, the process of supplying the chemical liquid onto the substrate can be performed using an apparatus for supplying chemical liquid including chemical liquid supply head which can provide the chemical liquid onto the substrate by a jetting process.

If the error of the chemical liquid supply head is caused in the process of supplying the chemical liquid, the chemical liquid may not be accurately provided onto desired regions of the substrate. To this end, a maintenance process may be frequently performed on the chemical liquid supply head. In the maintenance process for the chemical liquid supply head, the chemical liquid supply head has no chemical liquid therein so that the chemical liquid remaining in the chemical liquid supply head is discharged from the chemical liquid supply head.

However, the chemical liquid discharged from the chemical liquid supply head in maintenance process for the chemical liquid supply head may be exposed to an outside, and thus the relatively expensive chemical liquid may be discarded because the chemical liquid may be easily contaminated.

SUMMARY

In aspects of the invention, there is provided an apparatus capable of recycling a chemical liquid discharged from a chemical liquid supply head thereof in a maintenance process for the chemical liquid supply head.

According to an aspect of the invention, there is provided an apparatus for supplying chemical liquid including a chemical liquid supply head, a receiving member, a removing member and a supplying member. The chemical liquid supply head may provide a chemical liquid onto a substrate. The receiving member may receive a recycle chemical liquid discharged from the chemical liquid supply head. The removing member may remove impurities remaining in the recycle chemical liquid received in the receiving member. The supplying member may provide the recycle chemical liquid from which the impurities are removed to the chemical liquid supply head.

In example embodiment, the recycle chemical liquid may be a chemical liquid remaining in the chemical liquid supply head, may be discharged from the chemical liquid supply head in a maintenance process for the chemical liquid supply head, and may be received in the receiving member.

In example embodiment, the receiving member may be sealed such that the recycle chemical liquid discharged from the chemical liquid supply head is not exposed to an outside.

In example embodiment, the removing member may include a particle removing filter for removing particles remaining in the recycle chemical liquid and/or a bubble removing filter for removing bubbles generated in the recycle chemical liquid.

In example embodiment, the apparatus for supplying chemical liquid may additionally include a chemical liquid reservoir for storing a new chemical liquid provided to the chemical liquid supply head, and a canister for storing the new chemical liquid provided to the chemical liquid reservoir. In this case, the supplying member may include at least one selected from a first supplying member being connected to a connection line connecting the canister to the chemical liquid reservoir and providing the recycle chemical liquid to the chemical liquid supply head; a second supplying member being connected to the chemical liquid reservoir and providing the recycle chemical liquid to the chemical liquid supply head; and a third supplying member directly providing the recycle chemical liquid to the chemical liquid supply head.

In example embodiment, the apparatus for supplying chemical liquid may additionally include a selecting member for selecting an operation of the at least one selected from the first supplying member, the second supplying member and the third supplying member.

In example embodiment, the apparatus for supplying chemical liquid may additionally include a first controlling member for stopping a supply of the recycle chemical liquid to the chemical liquid supply head such that only the new chemical liquid is provided to the chemical liquid supply head, and a second controlling member for stopping a supply of the new chemical liquid to the chemical liquid supply head such that only the recycle chemical liquid is provided to the chemical liquid supply head.

In example embodiment, the apparatus for supplying chemical liquid may additionally include an inspecting member for inspecting the recycle chemical liquid from which the impurities are removed by the removing member, and a discharging member for discharging the recycle chemical liquid to an outside when the recycle chemical liquid is unusable.

According to another aspect of the invention, there is provided an apparatus for supplying chemical liquid including a chemical liquid supply head, a chemical liquid reservoir, a canister, a receiving member, a removing member, and a supplying member. The chemical liquid supply head may provide a chemical liquid onto a substrate. The chemical liquid reservoir may store a new chemical liquid provided to the chemical liquid supply head. The canister may store the new chemical liquid provided to the chemical liquid reservoir. The receiving member may receive a recycle chemical liquid discharged from the chemical liquid supply head. The removing member may remove impurities remaining in the recycle chemical liquid received in the receiving member. The supplying member may provide the recycle chemical liquid from which the impurities are removed to the chemical liquid supply head. Additionally, the supplying member may be connected to a connection line for connecting the canister to the chemical liquid reservoir.

In example embodiments, the recycle chemical liquid may be a chemical liquid remaining in the chemical liquid supply head, may be discharged from the chemical liquid supply head in a maintenance process for the chemical liquid supply head, and may be received in the receiving member.

In example embodiments, the receiving member may be sealed such that the recycle chemical liquid discharged from the chemical liquid supply head is not exposed to an outside.

In example embodiments, the removing member may include a particle removing filter for removing particles remaining in the recycle chemical liquid and/or a bubble removing filter for removing bubbles generated in the recycle chemical liquid.

In example embodiments, the apparatus for supplying chemical liquid may additionally include a first controlling member for stopping a supply of the recycle chemical liquid to the chemical liquid supply head such that only the new chemical liquid is provided to the chemical liquid supply head, and a second controlling member for stopping a supply of the new chemical liquid to the chemical liquid supply head such that only the recycle chemical liquid is provided to the chemical liquid supply head.

In example embodiments, the supplying member may include at least one selected from a first supplying member being connected to a connection line connecting the canister to the chemical liquid reservoir and providing the recycle chemical liquid to the chemical liquid supply head; a second supplying member being connected to the chemical liquid reservoir and providing the recycle chemical liquid to the chemical liquid supply head, and a third supplying member directly providing the recycle chemical liquid to the chemical liquid supply head.

In example embodiments, the apparatus for supplying chemical liquid may additionally include a selecting member for selecting an operation of the at least one selected from the first supplying member, the second supplying member and the third supplying member.

In example embodiments, the apparatus for supplying chemical liquid may additionally include an inspecting member for inspecting the recycle chemical liquid from which the impurities are removed by the removing member, and a discharging member for discharging the recycle chemical liquid to an outside when the recycle chemical liquid is unusable.

According to still another aspect of the invention, there is provided an apparatus for supplying chemical liquid a chemical liquid supply head, a chemical liquid reservoir, a canister, a receiving member, a removing member, a supplying member, a selecting member, an inspecting member, and a discharging member. The chemical liquid supply head may provide a chemical liquid onto a substrate. The chemical liquid reservoir may store a new chemical liquid provided to the chemical liquid supply head. The canister may store the new chemical liquid provided to the chemical liquid reservoir. The receiving member may receive a recycle chemical liquid discharged from the chemical liquid supply head. The removing member may remove impurities remaining in the recycle chemical liquid received in the receiving member. The supplying member may provide the recycle chemical liquid from which the impurities are removed to the chemical liquid supply head. The supplying member may include at least one selected from a first supplying member connected to a connection line connecting the canister to the chemical liquid reservoir, a second supplying member connected to the chemical liquid reservoir, and a third supplying member directly providing the recycle chemical liquid to the chemical liquid supply head. The selecting member may select an operation of the at least one selected from the first supplying member, the second supplying member and the third supplying member. The inspecting member may inspect the recycle chemical liquid from which the impurities are removed by the removing member. The discharging member may discharge the recycle chemical liquid to an outside when the recycle chemical liquid is unusable.

In example embodiments, the receiving member may be sealed such that the recycle chemical liquid discharged from the chemical liquid supply head is not exposed to an outside.

In example embodiments, the removing member may include a particle removing filter for removing particles remaining in the recycle chemical liquid and/or a bubble removing filter for removing bubbles generated in the recycle chemical liquid.

In example embodiments, the apparatus for supplying chemical liquid may additionally include a first controlling member for stopping a supply of the recycle chemical liquid to the chemical liquid supply head such that only the new chemical liquid is provided to the chemical liquid supply head, and a second controlling member for stopping a supply of the new chemical liquid to the chemical liquid supply head such that only the recycle chemical liquid is provided to the chemical liquid supply head.

According to example embodiments of the invention, the apparatus for supplying chemical liquid may recycle the chemical liquid discharged from the chemical liquid supply head, particularly the chemical liquid discharged from the chemical liquid supply head in the maintenance process for the chemical liquid supply head. Therefore, the error of the chemical liquid supply head may be prevented and the cost for manufacturing the display device may be reduced by minimizing the consumption of the relatively expensive chemical liquid.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
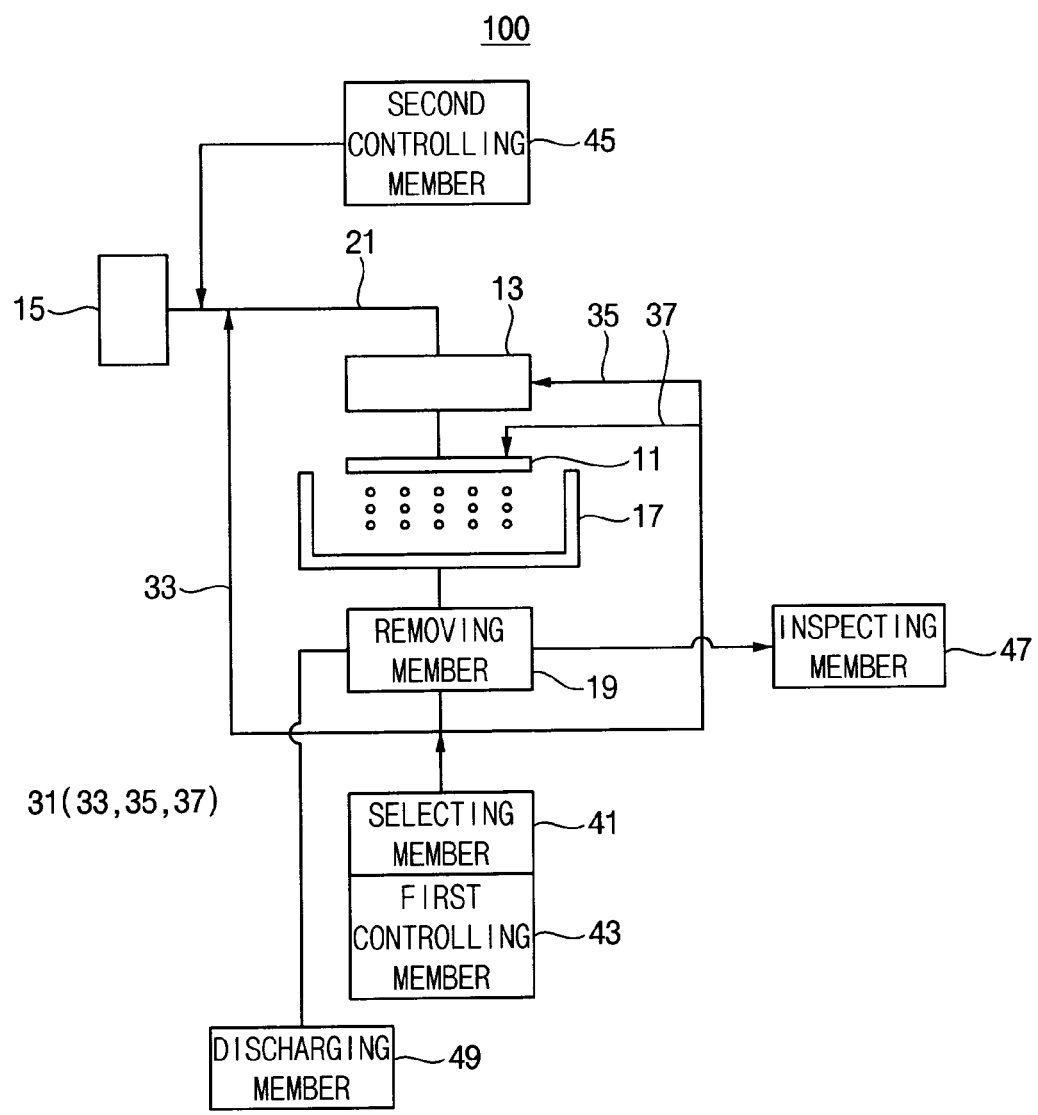
FIG. 1 is a block diagram illustrating an apparatus for supplying chemical liquid in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

FIG. 1 is a block diagram illustrating an apparatus for supplying chemical liquid in accordance with example embodiments of the invention.

Referring to FIG. 1, an apparatus for supplying chemical liquid 100 according to example embodiments may be used in a process of supplying desired chemical liquid onto a substrate so as to manufacture a display device, for example, an organic light emitting display device. In particular, the apparatus for supplying chemical liquid 100 may be employed in a process of forming various pixels on a substrate or a process of forming an encapsulation layer protecting circuit patterns formed on a substrate.

In example embodiments, the apparatus for supplying chemical liquid 100 may include a chemical liquid supply head 11 which may provide the chemical liquid onto the substrate by a jetting process.

The chemical liquid supply head 11 may include a plurality of nozzles wherein the plurality of nozzles may be arranged by predetermined intervals. For example, each of the nozzles of the chemical liquid supply head 11 may substantially spray the chemical liquid onto the substrate by the unit of μm.

The apparatus for supplying chemical liquid 100 may further include a chemical liquid reservoir 13 and a canister 15. The chemical liquid reservoir 13 may store the chemical liquid provided to the chemical liquid supply head 11 and the canister 15 may store new chemical liquid supplied into the chemical liquid reservoir 13 from an outside.

The chemical liquid reservoir 13 may directly supply the chemical liquid to the chemical liquid supply head 11. The chemical liquid reservoir 13 may enable the chemical liquid supply head 11 to provide the chemical liquid onto the substrate, for example, through the adjustment of negative pressure and/or positive pressure.

The canister 15 may be connected to the chemical liquid reservoir 13 by q connection line 21. The canister 15 may apply, for example, a relatively high pressure to the chemical liquid such that the chemical liquid may be easily supplied into the chemical liquid reservoir 13.

In example embodiments, the apparatus for supplying chemical liquid 100 may have a configuration in which the chemical liquid may be supplied to the chemical liquid supply head 11 via the chemical liquid reservoir 13.

In some example embodiments, the apparatus for supplying chemical liquid 100 may further include a stage, a gantry and a transferring member. The stage may receive the substrate thereon. For example, the stage may be a floating stage which may float the substrate thereover. The gantry may be disposed to across the stage along a direction substantially perpendicular to a direction in which the substrate is transferred by the transferring member. The gantry mat support the chemical liquid supply head 11 such that the chemical liquid supply head 11 may move over the substrate positioned on or over the stage. For example, the gantry may include a horizontal member having a substantial bar shape and a vertical member having a substantial pillar. Here, the horizontal member may locate over the stage to traverse the stage and the vertical member may support end portions of the horizontal member. The transferring member may transfer the substrate on or over the stage. For example, the transferring member may transfer the substrate by gripping side end portions of the substrate.

In some example embodiments, the apparatus for supplying chemical liquid 100 may provide the chemical liquid onto the substrate from the chemical liquid supply head 11 moving the gantry while transferring the substrate on or over the stage by the transferring member, as described above.

In the process performed using the apparatus for supplying chemical liquid 100 having the above-described configuration, the chemical liquid may not be correctly provided onto desired regions of the substrate if the error of the chemical liquid supply head 11, for example, the blocking of the nozzles is generated.

Considering such a problem, a maintenance process may be executed on the chemical liquid supply head 11 in the operation of the apparatus for supplying chemical liquid 100. The maintenance process for the chemical liquid supply head 11 may generally include cleaning a nozzle face of the chemical liquid supply head 11 (that is, a face on which the nozzles are arranged), cleaning a flow path provided in the chemical liquid supply head 11, etc.

When the maintenance process for the chemical liquid supply head 11 is performed, the cleaning of the chemical liquid supply head 11 may not be completely accomplished if the chemical liquid remains in the chemical liquid supply head 11. Therefore, the remaining chemical liquid in the chemical liquid supply head 11 may be removed from the chemical liquid supply head 11 by discharging the chemical liquid from the chemical liquid supply head 11.

In the apparatus for supplying chemical liquid 100 according to example embodiments, the chemical liquid removed from the chemical liquid supply head 11 in the maintenance process for the chemical liquid supply head 11 may be recycled. To this end, the apparatus for supplying chemical liquid 100 may further include a receiving member 17, a removing member 19, a supplying member 31, a selecting member 41, a first controlling member 43, a second controlling member 45, an inspecting member 47, and a discharging member 49. In this case, the receiving member 17, the removing member 19, the supplying member 31, the selecting member 41, the first controlling member 43, the second controlling member 45, the inspecting member 47, and the discharging member 49 may be disposed to be adjacent to a maintenance chamber (not illustrated). Particularly, the receiving member 17 may be substantially sealed so that the receiving member 17 may be preferably disposed in the maintenance chamber.

Meanwhile, the chemical liquid supply head 11 and the gantry may be disposed between a process chamber and the maintenance chamber. Here, the gantry holding the chemical liquid supply head 11 may be adjacent to the process chamber when the chemical liquid is provided onto the substrate, and may be adjacent to the maintenance chamber when the maintenance process for the chemical liquid supply head 11 is performed.

In the maintenance process for the chemical liquid supply head 11, the chemical liquid remaining in the chemical liquid supply head 11 and/or the nozzles may be discharged from the chemical liquid supply head 11. At this time, the receiving member 17 may receive the chemical liquid discharged from the chemical liquid supply head 11. For example, the receiving member 17 may include a tub.

If the chemical liquid removed from the chemical liquid supply head 11 is exposed to an outside, the chemical liquid may be contaminated. Therefore, the receiving member 17 may be substantially sealed such that the chemical liquid discharged from the chemical liquid supply head 11 may not be exposed to the outside.

As illustrated in FIG. 1, the removing member 19 may remove impurities remaining in the chemical liquid received in the receiving member 17 from the chemical liquid. For example, the removing member 19 may include a particle removing filter, a bubble removing member, etc. Here, the particle removing filter may remove particles from the chemical liquid and the bubble removing filter may remove bubbles generated in the chemical liquid. Alternatively, the removing member 19 may selectively include the particle removing filter or the bubble removing filter. In example embodiments, the removing member 19 may be disposed in a path through which the chemical liquid flows from the receiving member 18 to the supplying member 31.

The supplying member 31 may provide the recycle chemical liquid which is the recycle chemical liquid purified using the removing member 19 to the chemical liquid supply head 11. The supplying member 31 may be disposed in a path through which the recycle chemical liquid flows from the removing member 19 to the chemical liquid supply head 11. The supplying member 31 may simultaneously provide the new chemical liquid and the recycle chemical liquid to the chemical liquid supply head 11. Alternatively, the supplying member 31 may separately provide the new chemical liquid and the recycle chemical liquid to the chemical liquid supply head 11.

In example embodiments, the supplying member 31 of the apparatus for supplying chemical liquid may include a first supplying member 33, a second supplying member 35 and a third supplying member 37. According to some example embodiments, the supplying member 31 may include at least one of the first supplying member 33, the second supplying member 35 and the third supplying member 37. For example, the supplying member 31 may include only the first supplying member 33, the second supplying member 35 or the third supplying member 37, or may include the first supplying member 33 and the second supplying member 35, or may include the first supplying member 33 and the third supplying member 37, or may include the second supplying member 35 and the third supplying member 37, or may include the first supplying member 33, the second supplying member 35 and the third supplying member 37.

The first supplying member 33 may be connected to the connection line 21 through which the new chemical liquid may be supplied from the canister 15 to the chemical liquid reservoir 13. Therefore, the recycle chemical liquid may be provided from the first supplying member 33 to the chemical liquid supply head 11 along with the new chemical liquid through the connection line 21.

The second supplying member 35 may be connected to the chemical liquid reservoir 13 so that the second supplying member 35 may provide the recycle chemical liquid to the chemical liquid supply head 11. Therefore, the new chemical liquid from the chemical liquid reservoir 13 and the recycle chemical liquid from the second supplying member 35 may be provided together to the chemical liquid supply head 11.

The third supplying member 37 may be directly connected to the third supplying member 37 such that the third supplying member 37 may directly provide the recycle chemical liquid to the chemical liquid supply head 11. Thus, the third supplying member 37 may only provide the recycle chemical liquid to the chemical liquid supply head 11, which may be different from the second supplying member 35.

For the operations of the first supplying member 33, the second supplying member 35 and the third supplying member 37, the apparatus for supplying chemical liquid 100 may include the selecting member 41 and the selecting member 41 may selectively operate at least one of the first supplying member 33, the second supplying member 35 and the third supplying member 37. For example, the selecting member 41 may include valves which may be on/off for controlling the flow of the recycled chemical liquid through supply lines coupled to the first supplying member 33, the second supplying member 35 and the third supplying member 37.

As described above, the apparatus for supplying chemical liquid 100 may accomplish various paths for supplying the chemical liquid using the supplying member 31 and the selecting member 41 such that the new chemical liquid as well as the recycle chemical liquid may be supplied to the chemical liquid supply head 11 through these various paths. For example, the apparatus for supplying chemical liquid 100 may provide only the new chemical liquid to the chemical liquid supply head 11, or may provide only the recycle chemical liquid to the chemical liquid supply head 11, or may provide the new chemical liquid along with the recycle chemical liquid to the chemical liquid supply head 11. Therefore, the cost for manufacturing the display device such as the organic light emitting display device may be reduced by using the apparatus for supplying chemical liquid 100.

In example embodiments, the apparatus for supplying chemical liquid 100 may include the first controlling member 43 and the second controlling member 45. The first controlling member 43 may stop the supply of the recycle chemical liquid to the chemical liquid supply head 11 such that only the new chemical liquid may be supplied to the chemical liquid supply head 11 from the canister 15. The second controlling member 45 may stop the supply of the new chemical liquid to the chemical liquid supply head 11 so that only the recycle chemical liquid may be provided to the chemical liquid supply head 11 from the removing member 19. In some example embodiments, the apparatus for supplying chemical liquid 100 may provide both the new chemical liquid and the recycle chemical liquid to the chemical liquid supply head 11 using the supplying member 31, the selecting member 41, the first controlling member 43 and the second controlling member 45.

When the supplying member 31 includes more than two of the first supplying member 33, the second supplying member 35 and the third supplying member 37, the first controlling member 43 may include a valve which may be on/off so as to control the supply lines adjacent to the removing member 19 before the supply lines are divided. In addition, the second controlling member 45 may include a valve which may be on/off so as to control the connection line 21 between the canister 15 and the chemical liquid reservoir 13. Particularly, the second controlling member 45 may be connected to the connection line 21 before the first supplying member 33 is connected to the connection line 21. That is, the second controlling member 45 may be connected to a point of the connection line 21 between the canister 15 and a point of the connection line 21 to which the first supplying member 33 is connected.

As described above, the apparatus for supplying chemical liquid 100 according to example embodiments may provide desired chemical liquid selected from the new chemical liquid and the recycle chemical liquid to the chemical liquid supply head 11 using the first controlling member 43 and the second controlling member 45. Therefore, the process of supplying chemical liquid may be executed under more various process conditions using the apparatus for supplying chemical liquid 100.

In example embodiments, the recycle chemical liquid obtained using the apparatus for supplying chemical liquid 100 may be needed to identify a composition and/or a quality thereof. To this end, the apparatus for supplying chemical liquid 100 may include the inspecting member 47, and the inspecting member 47 may inspect the recycle chemical liquid in which the impurities are removed by the removing member 19. Alternatively, the inspecting member 47 may inspect the recycle chemical liquid received in the receiving member 17, or may inspect both the chemical liquid received in the receiving member 17 and the recycle chemical liquid in which the impurities are removed by the removing member 19.

After the recycle chemical liquid is inspected using the inspecting member 47, the recycle chemical liquid may be provided to the chemical liquid supply head 11 when the recycle chemical is usable. However, when the recycle chemical liquid is unusable, the recycle chemical liquid may be discharged to the outside. To this end, the apparatus for supplying chemical liquid 100 may include the discharging member 49 so as to discharge the unusable recycle chemical liquid.

When the inspecting member 47 performs an inspection process on the recycle chemical liquid from which the impurities are removed by the removing member 19, the discharging member 49 may be disposed downstream from the inspecting member 47. When the inspecting member 47 executes the inspection process on the chemical liquid received in the receiving member 17, the discharging member 49 may be connected to the receiving member 17 so as to discharge the unusable recycle chemical liquid.

As described above, the apparatus for supplying chemical liquid 100 according to example embodiments may include the inspecting member 47 and the discharging member 49 such that the process of supplying the recycle chemical liquid onto the substrate may be more reliably performed. Further, the apparatus for supplying chemical liquid 100 may not discard the chemical liquid remaining in the chemical liquid supply head 11 in the maintenance process for the chemical liquid supply head 11, and then may recycle the chemical liquid removed from the chemical liquid supply head 11. Therefore, the apparatus for supplying chemical liquid 100 may minimize the consumption of the relatively expensive chemical liquid.

Figure 2:
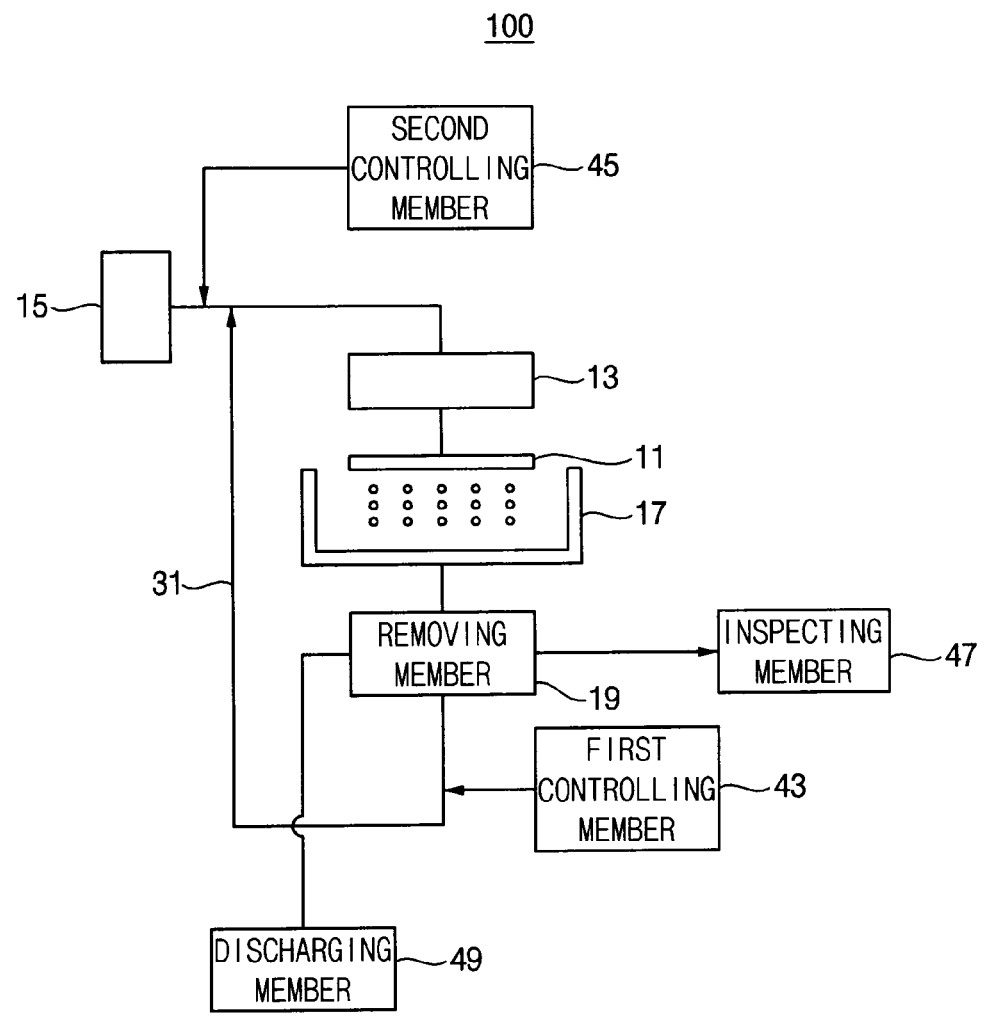
FIG. 2 is a block diagram illustrating an apparatus for supplying chemical liquid in accordance with some example embodiments of the invention.

FIG. 2 is a block diagram illustrating an apparatus for supplying chemical liquid in accordance with some example embodiments of the invention. The apparatus for supplying chemical liquid illustrated in FIG. 2 may have a configuration substantially the same as that of the apparatus for supplying chemical liquid of FIG. 1 except the supplying member 31 and the selecting member 41.

Referring to FIG. 2, the apparatus for supplying chemical liquid 100 according to some example embodiments may include a chemical liquid supply head 11, a stage, a gantry and a transferring member. Further, the apparatus for supplying chemical liquid 100 may include a receiving member 17, a removing member 19, a supplying member 31, a first controlling member 43, a second controlling member 45, an inspecting member 47 and a discharging member 49 so as to recycle a chemical liquid remaining in the chemical liquid supply head 11 during a maintenance process for the chemical liquid supply head 11.

The supplying member 31 may be connected to a connection line 21 for connecting a canister 15 to a chemical liquid reservoir 13 so that the supplying member 31 may provide a recycle chemical liquid obtained in the maintenance process for the chemical liquid supply head 11 to the chemical liquid supply head 11.

The first controlling member 43 may stop a supply of the recycle chemical liquid to the chemical liquid supply head 11 from the supplying member 31 such that only the new chemical liquid may be provided to the chemical liquid supply head 11. The second controlling member 45 may stop a supply of the new liquid to the chemical liquid supply head 11 from the canister 15 so that only the recycle chemical liquid may be provided to the chemical liquid supply head 11.

In the apparatus for supplying chemical liquid 100 illustrated in FIG. 2, the supplying member 31 may have a single configuration such that the selecting member 41 of FIG. 1 may be omitted and the second controlling member 45 may be connected to a point of the connection line 21 more closer to the canister 15 than a point of the connection line 21 to which the supplying member 31 is connected.

As described above, the apparatus for supplying chemical liquid 100 may include the supplying member 31 of the single configuration, and thus may have a more simple structure as well as may minimize a consumption of the relatively expensive chemical liquid by utilizing the recycle chemical liquid obtained in the maintenance process for the chemical liquid supply head 11.

Figure 3:
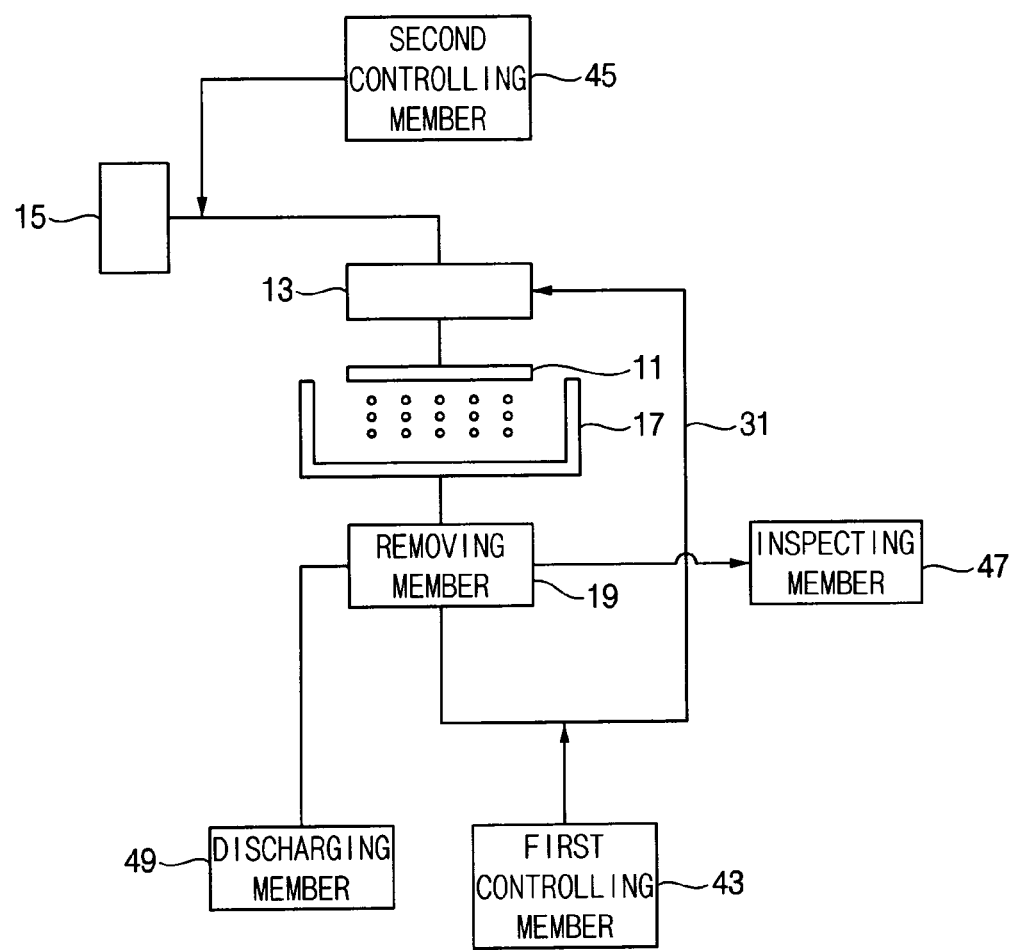
FIG. 3 is a block diagram illustrating an apparatus for supplying chemical liquid in accordance with other example embodiments of the invention.

FIG. 3 is a block diagram illustrating an apparatus for supplying chemical liquid in accordance with other example embodiments of the invention. The apparatus for supplying chemical liquid illustrated in FIG. 3 may have a configuration substantially the same as that of the apparatus for supplying chemical liquid of FIG. 1 except the supplying member 31 and the selecting member 41.

Referring to FIG. 3, the apparatus for supplying chemical liquid 100 according to other example embodiments may include a chemical liquid supply head 11, a stage, a gantry and a transferring member. Further, the apparatus for supplying chemical liquid 100 may include a receiving member 17, a removing member 19, a supplying member 31, a first controlling member 43, a second controlling member 45, an inspecting member 47 and a discharging member 49 so as to recycle a chemical liquid remaining in the chemical liquid supply head 11 during a maintenance process for the chemical liquid supply head 11.

The supplying member 31 may be connected to a chemical liquid reservoir 13, and thus supplying member 31 may provide a recycle chemical liquid obtained in the maintenance process for the chemical liquid supply head 11 to the chemical liquid supply head 11.

The first controlling member 43 may stop a supply of the recycle chemical liquid to the chemical liquid supply head 11 from the supplying member 31 such that only the new chemical liquid may be provided to the chemical liquid supply head 11. The second controlling member 45 may stop a supply of the new liquid to the chemical liquid supply head 11 from a canister 15 so that only the recycle chemical liquid may be provided to the chemical liquid supply head 11.

In the apparatus for supplying chemical liquid 100 illustrated in FIG. 2, the supplying member 31 may have a single configuration such that the selecting member 41 of FIG. 1 may be omitted.

As described above, the apparatus for supplying chemical liquid 100 may include the supplying member 31 of the single configuration such that the apparatus for supplying chemical liquid 100 may have a more simple structure as well as may minimize a consumption of the relatively expensive chemical liquid by utilizing the recycle chemical liquid obtained in the maintenance process for the chemical liquid supply head 11.

According to example embodiments of the invention, in manufacturing processes for a display device such as an organic light emitting display device, the apparatus for supplying chemical liquid may be advantageously used in a process of supplying chemical liquid onto a substrate for forming pixels on the substrate, and in a process of supplying chemical liquid onto the substrate for forming an encapsulation layer protecting circuit patterns formed on the substrate.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for supplying chemical liquid, which comprises:
    a chemical liquid supply head for providing a chemical liquid onto a substrate;
    a receiving member for receiving a recycle chemical liquid discharged from the chemical liquid supply head;
    a removing member for removing impurities remaining in the recycle chemical liquid received in the receiving member;
    a supplying member for providing the recycle chemical liquid from which the impurities are removed to the chemical liquid supply head, the supplying member including a first supplying member that is coupled to a connection line through which new chemical liquid is supplied to the chemical liquid supply head, the connection line being configured to provide to the chemical liquid supply head a mix of the new chemical liquid and the recycle chemical liquid
    a chemical liquid reservoir for storing the new chemical liquid; and
    a canister for storing the new chemical liquid provided to the chemical liquid reservoir,
    wherein the supplying member further includes: a second supplying member being connected to the chemical liquid reservoir and providing the recycle chemical liquid to the chemical liquid supply head; and a third supplying member directly providing the recycle chemical liquid to the chemical liquid supply head.

2. The apparatus of claim 1, wherein the recycle chemical liquid is discharged from the chemical liquid supply head in a maintenance process and is received in the receiving member.

3. The apparatus of claim 1, wherein the receiving member is sealed.

4. The apparatus of claim 1, wherein the removing member includes a particle removing filter for removing particles from the recycle chemical liquid and/or a bubble removing filter for removing bubbles from the recycle chemical liquid.

5. The apparatus of claim 1, further comprising a selecting member for selecting at least one of the first supplying member, the second supplying member and the third supplying member.

6. The apparatus of claim 1, further comprising:
a first controlling member for stopping a supply of the recycle chemical liquid to the chemical liquid supply head such that only the new chemical liquid is provided to the chemical liquid supply head; and
a second controlling member for stopping a supply of the new chemical liquid to the chemical liquid supply head such that only the recycle chemical liquid is provided to the chemical liquid supply head.

7. The apparatus of claim 1, further comprising:
an inspecting member for inspecting the recycle chemical liquid from which the impurities are removed; and
a discharging member for discharging the recycle chemical liquid.

8. An apparatus for supplying chemical liquid, which comprises:
a chemical liquid supply head for providing a chemical liquid onto a substrate;
a chemical liquid reservoir for storing a new chemical liquid provided to the chemical liquid supply head;
a canister for storing the new chemical liquid provided to the chemical liquid reservoir;
a receiving member for receiving a recycle chemical liquid discharged from the chemical liquid supply head;
a removing member for removing impurities remaining in the recycle chemical liquid received in the receiving member; and
a supplying member for providing the recycle chemical liquid from which the impurities are removed to the chemical liquid supply head, wherein the supplying member includes a first supplying member that is connected to a connection line for connecting the canister to the chemical liquid reservoir, the connection line being configured to provide to the chemical supply liquid head a mix of the new chemical liquid and the recycle chemical liquid;
wherein the supplying member further includes: a second supplying member being connected to the chemical liquid reservoir and providing the recycle chemical liquid to the chemical liquid supply head; and a third supplying member directly providing the recycle chemical liquid to the chemical liquid supply head.

9. The apparatus of claim 8, wherein the recycle chemical liquid is discharged from the chemical liquid supply head in a maintenance process and is received in the receiving member.

10. The apparatus of claim 8, wherein the receiving member is sealed.

11. The apparatus of claim 8, wherein the removing member includes a particle removing filter for removing particles from the recycle chemical liquid and/or a bubble removing filter for removing bubbles from the recycle chemical liquid.

12. The apparatus of claim 8, further comprising:
a first controlling member for stopping a supply of the recycle chemical liquid to the chemical liquid supply head such that only the new chemical liquid is provided to the chemical liquid supply head; and
a second controlling member for stopping a supply of the new chemical liquid to the chemical liquid supply head such that only the recycle chemical liquid is provided to the chemical liquid supply head.

13. The apparatus of claim 8, further comprising a selecting member for selecting at least one of the first supplying member, the second supplying member and the third supplying member.

14. The apparatus of claim 8, further comprising:
an inspecting member for inspecting the recycle chemical liquid from which the impurities are removed; and
a discharging member for discharging the recycle chemical liquid.

15. An apparatus for supplying chemical liquid, which comprises:
a chemical liquid supply head for providing a chemical liquid onto a substrate;
a chemical liquid reservoir for storing a new chemical liquid provided to the chemical liquid supply head;
a canister for storing the new chemical liquid provided to the chemical liquid reservoir;
a receiving member for receiving a recycle chemical liquid discharged from the chemical liquid supply head;
a removing member for removing impurities remaining in the recycle chemical liquid received in the receiving member;
a supplying member for providing the recycle chemical liquid from which the impurities are removed to the chemical liquid supply head, wherein the supplying member includes a first supplying member connected to a connection line connecting the canister to the chemical liquid reservoir, the connection line being configured to provide to the chemical liquid supply head a mix of the new chemical liquid and the recycle chemical liquid, a second supplying member connected to the chemical liquid reservoir, and a third supplying member directly providing the recycle chemical liquid to the chemical liquid supply head;
a selecting member for selecting at least one of the first supplying member, the second supplying member and the third supplying member;
an inspecting member for inspecting the recycle chemical liquid from which the impurities are removed; and
a discharging member for discharging the recycle chemical liquid when the recycle chemical liquid is unusable.

16. The apparatus of claim 15, wherein the receiving member is sealed.

17. The apparatus of claim 15, wherein the removing member includes a particle removing filter for removing particles from the recycle chemical liquid and/or a bubble removing filter for removing bubbles from the recycle chemical liquid.

18. The apparatus of claim 15, further comprising:
a first controlling member for stopping a supply of the recycle chemical liquid to the chemical liquid supply head such that only the new chemical liquid is provided to the chemical liquid supply head; and
a second controlling member for stopping a supply of the new chemical liquid to the chemical liquid supply head such that only the recycle chemical liquid is provided to the chemical liquid supply head.

* * * * *